US009589982B1

(12) United States Patent
Cheng et al.

(10) Patent No.: US 9,589,982 B1
(45) Date of Patent: Mar. 7, 2017

(54) STRUCTURE AND METHOD OF OPERATION FOR IMPROVED GATE CAPACITY FOR 3D NOR FLASH MEMORY

(71) Applicant: MACRONIX INTERNATIONAL CO., LTD., Hsin-Chu (TW)

(72) Inventors: Cheng-Hsien Cheng, Yunlin County (TW); Chih-Wei Lee, New Taipei (TW); Shaw-Hung Ku, Hsinchu (TW); Wen-Pin Lu, Hsinchu County (TW)

(73) Assignee: MACRONIX INTERNATIONAL CO., LTD., Hsin-Chu (TW)

( * ) Notice: Subject to any disclaimer, the term of this patent is extended or adjusted under 35 U.S.C. 154(b) by 0 days.

(21) Appl. No.: 14/854,383

(22) Filed: Sep. 15, 2015

(51) Int. Cl.
*H01L 29/792* (2006.01)
*H01L 27/115* (2006.01)

(52) U.S. Cl.
CPC .... *H01L 27/11582* (2013.01); *H01L 27/1157* (2013.01); *H01L 27/11551* (2013.01); *H01L 27/11556* (2013.01); *H01L 27/11573* (2013.01); *H01L 27/11578* (2013.01)

(58) Field of Classification Search
CPC ......... H01L 27/11556; H01L 27/11578; H01L 27/11582; H01L 27/11551
See application file for complete search history.

(56) References Cited

U.S. PATENT DOCUMENTS

| | | | |
|---|---|---|---|
| 8,426,301 B2 * | 4/2013 | Oh | H01L 27/0688 257/E21.662 |
| 9,236,131 B1 * | 1/2016 | Yuan | |
| 2010/0078701 A1 * | 4/2010 | Shim | H01L 27/11521 257/314 |
| 2011/0032772 A1 * | 2/2011 | Aritome | H01L 27/11551 365/185.29 |
| 2011/0303971 A1 * | 12/2011 | Lee | H01L 27/11551 257/324 |
| 2012/0112260 A1 * | 5/2012 | Kim | H01L 27/11556 257/315 |
| 2013/0313631 A1 * | 11/2013 | Yang | H01L 27/088 257/329 |
| 2014/0332873 A1 * | 11/2014 | Yoo | H01L 27/11556 257/314 |
| 2015/0102282 A1 * | 4/2015 | Zhang | H01L 27/249 257/5 |

* cited by examiner

*Primary Examiner* — Marvin Payen
*Assistant Examiner* — Jeremy Joy
(74) *Attorney, Agent, or Firm* — Alston & Bird LLP

(57) ABSTRACT

Embodiments of the present invention provide improved three-dimensional memory cells, arrays, devices, and/or the like and associated methods. In one embodiment, a three-dimensional memory cell is provided. The three-dimensional memory cell comprises a first conductive layer; a third conductive layer spaced apart from the first conductive layer; a channel conductive layer connecting the first conductive layer and the third conductive layer to form an opening having internal surfaces; a dielectric layer disposed along the internal surfaces of the opening surrounded by the first conductive layer, the channel conductive layer and the third conductive layer; and a second conductive layer interposed and substantially filling a remaining open portion formed by the dielectric layer. The first conductive layer, the dielectric layer, and the second conductive layer are configured to form a staircase structure.

9 Claims, 12 Drawing Sheets

STRUCTURE AND METHOD OF OPERATION FOR IMPROVED GATE CAPACITY FOR 3D NOR FLASH MEMORY

TECHNOLOGICAL FIELD

Embodiments of the present invention relate generally to a semiconductor device, in particular, a three dimensional memory for improved gate capacity.

BACKGROUND

Semiconductor devices are typically classified as either volatile semiconductor devices, which require power to maintain storage of data, or non-volatile semiconductor devices, which can retain data even upon removal of a power source. An example non-volatile semiconductor device is a flash memory device, which generally includes a matrix of memory cells arranged in rows and columns. Each memory cell in the matrix includes a transistor structure having a gate, a drain, a source, and a channel defined between the drain and the source. Each memory cell is located at an intersection between a word line and a bit line, wherein the gate is connected to the word line, the drain is connected to the bit line, and the source is connected to a source line, which in turn is connected to common ground. The gate of a conventional flash memory cell generally comprises a dual-gate structure, including a control gate and a floating gate, wherein the floating gate is suspended between two oxide layers to trap electrons that program the cell.

Flash memory devices may in turn be classified as NOR or NAND flash memory devices. Of these, NOR flash memory typically offers faster program and read speeds whereby each cell connects to ground at one end and connects to the bit line at the other end. Using conventional manufacturing methods, NOR and NAND flash take a 2D form by which the memory cells are created in a two dimensional array on a silicon substrate. However, the 2D architecture has demonstrated limitations, such as the scaling limitations encountered due to the process and device restrictions. Therefore, a 3D architecture, which stacks cells on top of each other, has been developed with respect to 3D NAND flash offering faster program and erase. Accordingly, there is a need in the art to increase the scalability of performance of read operations and maximize the data capacity properties of 3D NOR devices.

BRIEF SUMMARY OF EXEMPLARY EMBODIMENTS

Embodiments of the present invention provide semiconductor devices, in particular, a gate structure for improved capacity, such as for 3D NOR flash memory.

In one aspect of the present invention, a three-dimensional memory cell is provided. In one embodiment, the three-dimensional memory cell comprises a first conductive layer and a third conductive layer. The third conductive layer is spaced apart from the first conductive layer. The three-dimensional memory cell further comprises a channel conductive layer. The channel conductive layer connects the first conductive layer and the third conductive layer. The channel conductive layer, first conductive layer, and third conductive layer form an opening having internal surfaces. A dielectric layer is disposed long the internal surfaces of the opening surrounded by the first conductive layer, the channel conductive layer, and the third conductive layer. The three-dimensional memory cell further comprises a second conductive layer interposed and substantially filling a remaining open portion formed by the dielectric layer. The first conductive layer, the dielectric layer, and the second conductive layer are configured to form a staircase structure.

In another aspect of the present invention, an apparatus for improving gate capacity of a nonvolatile memory device is provided. In one embodiment, the apparatus comprises a three-dimensional memory array. The memory array comprises a plurality of memory strings. Each of the plurality of memory strings comprises (a) a plurality of memory cells and (b) an end connected to a channel line. Each memory cell has (a) a first end connected to a bit line, (b) a second end connected to a source line, and (c) a third end connected to a word line. Each pair of adjacent memory cells shares one of a bit line and a source line.

In still another aspect of the present invention, a method for fabricating a string of memory cells for a three-dimensional memory array is provided. In one embodiment, the method comprises providing a layered structure, the layered structure comprising a cap layer, one or more third conductive layers, one or more sacrificial layers, one or more first conductive layers, and an insulating layer; forming a hole through a plurality of layers of the layered structure; depositing a channel conductive layer within the hole; removing at least one of the one or more sacrificial layers to providing one or more openings, each opening having internal surfaces; depositing a dielectric layer along the internal surfaces of each opening, resulting in a remaining opening; depositing a second conductive layer within the remaining opening, the second conductive layer substantially filling the remaining opening, wherein the first conductive layer, second conductive layer, third conductive layer, dielectric layer, and insulating layer are configured to form a staircase structure.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE SEVERAL VIEWS OF THE DRAWINGS

Figure 1A:
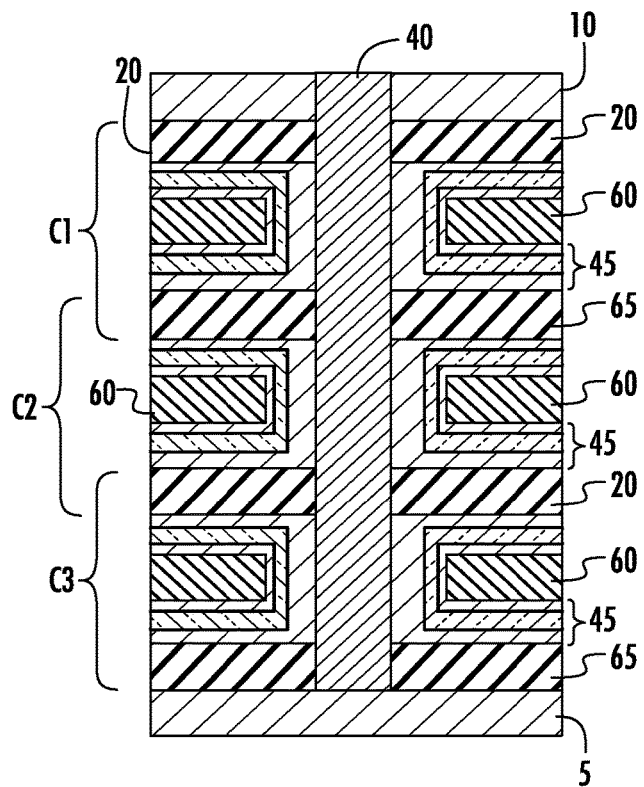
Figure 1B:
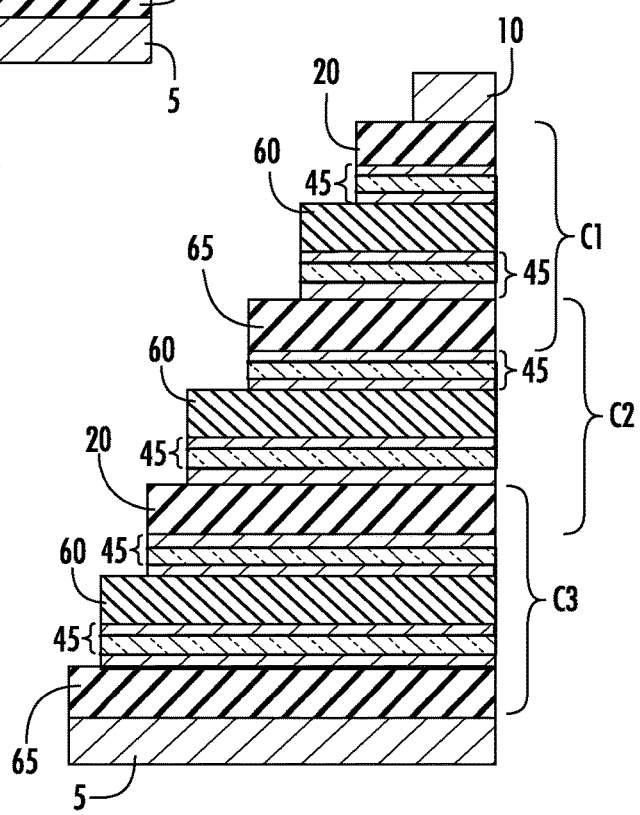
Figure 1C:
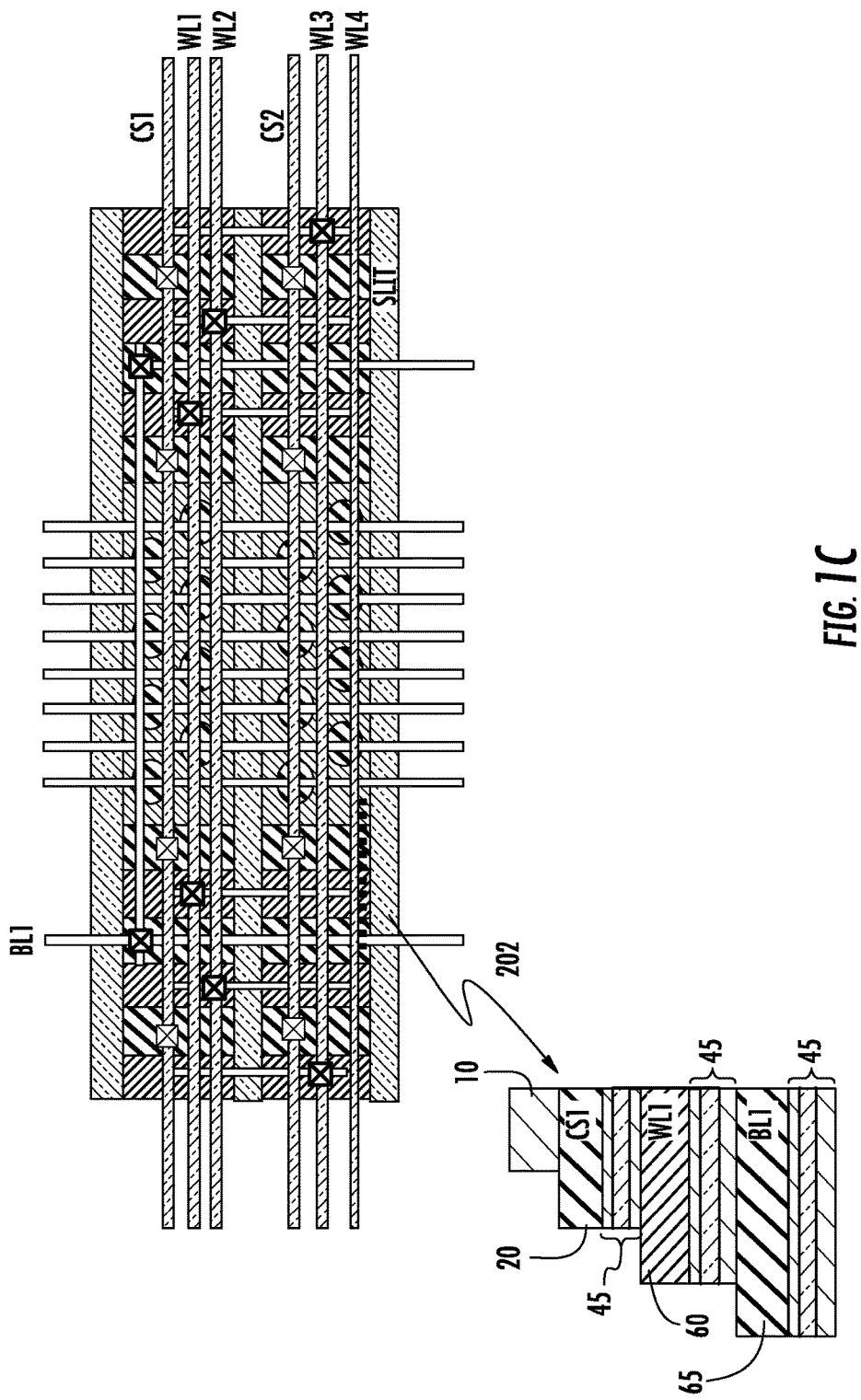
Figure 2A:
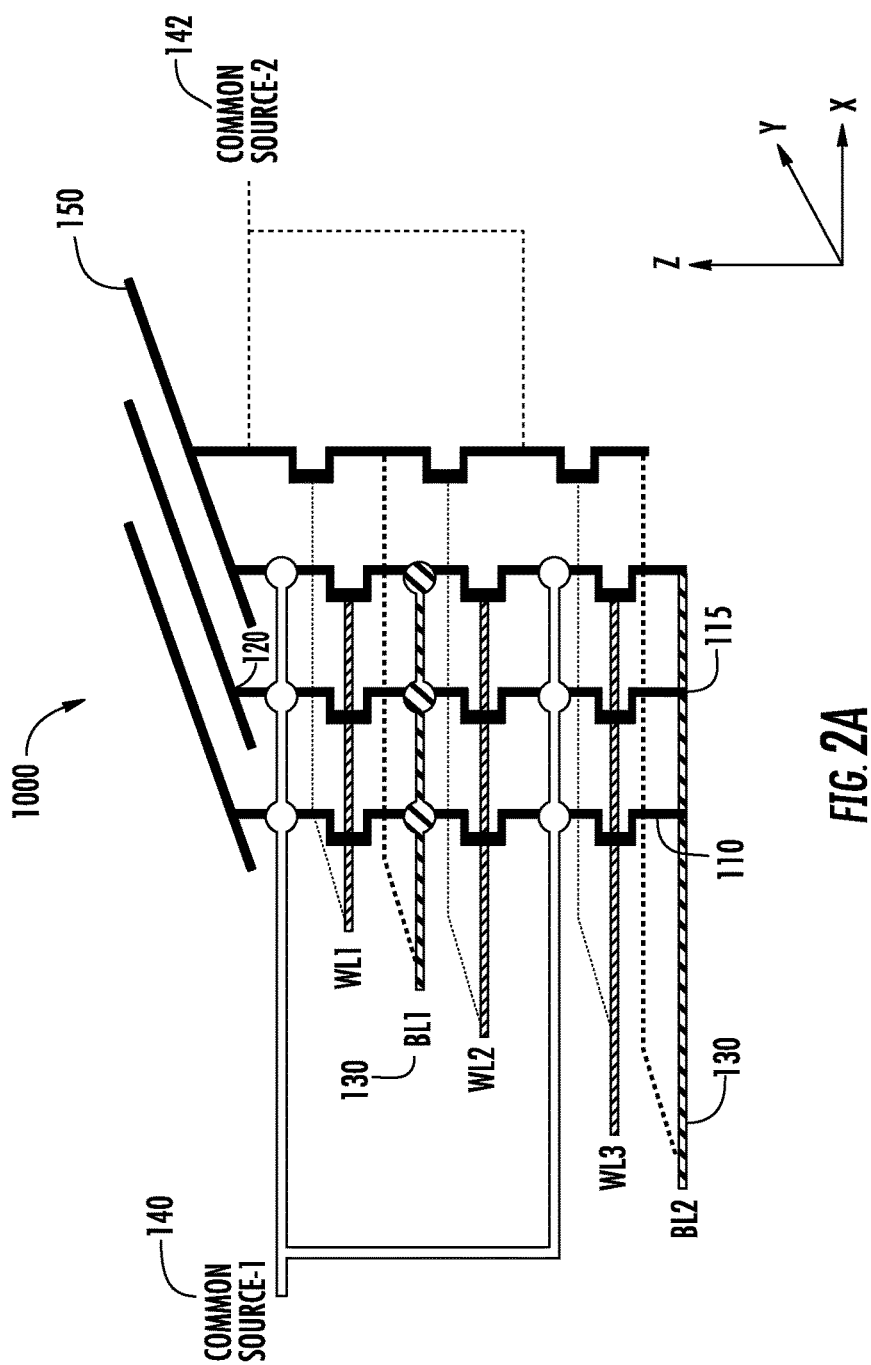
Figure 2B:
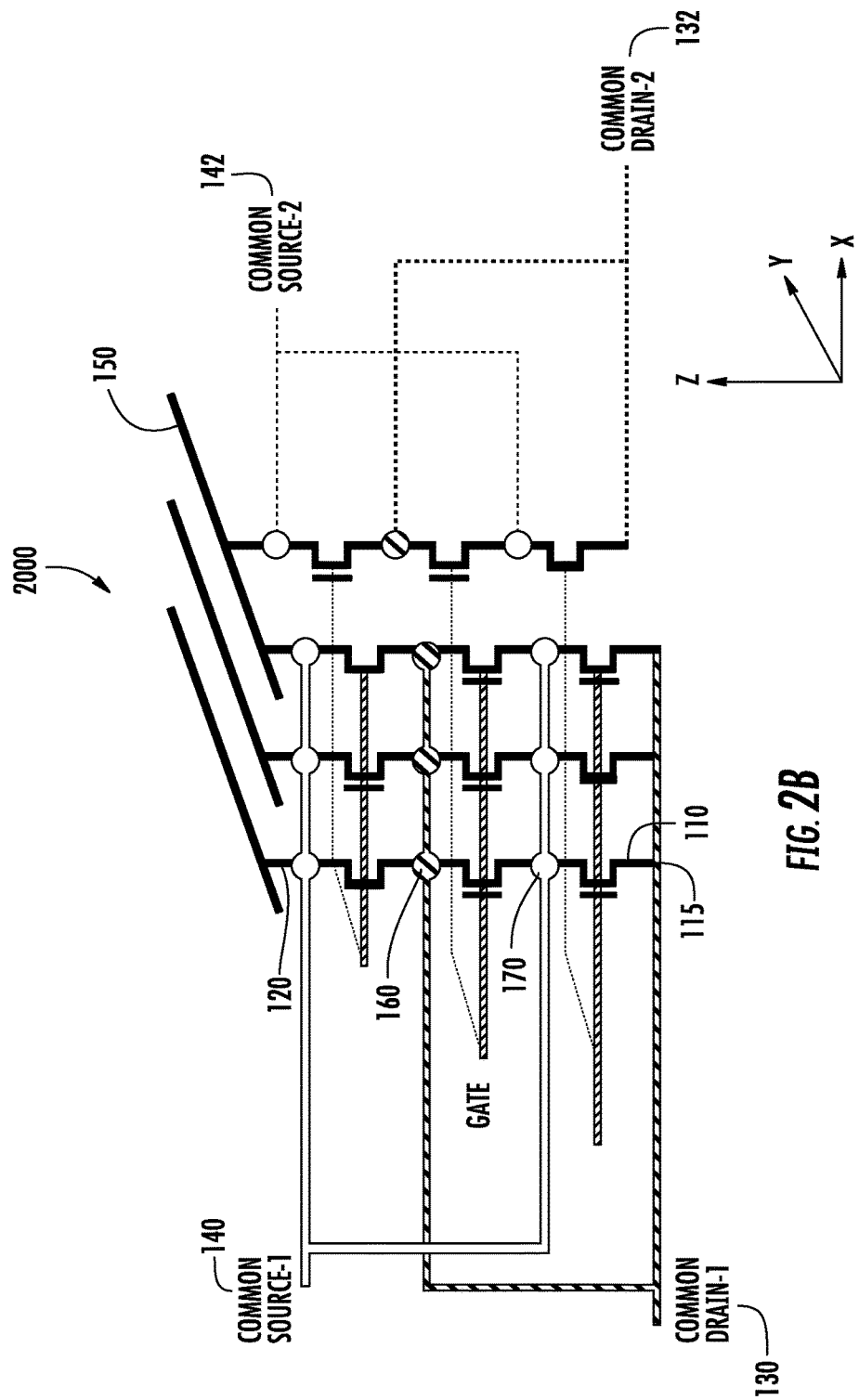
Figure 2C:
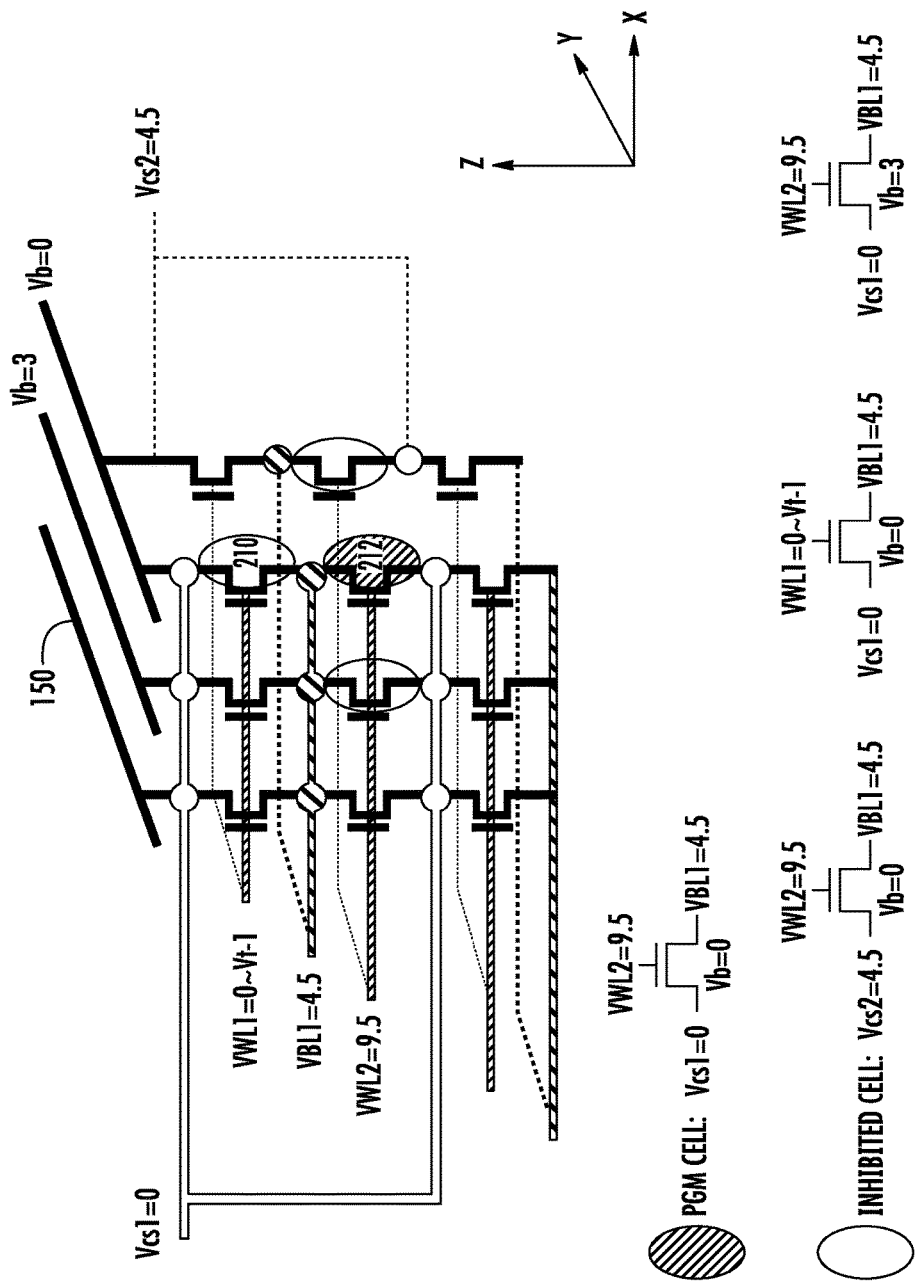
Figure 2D:
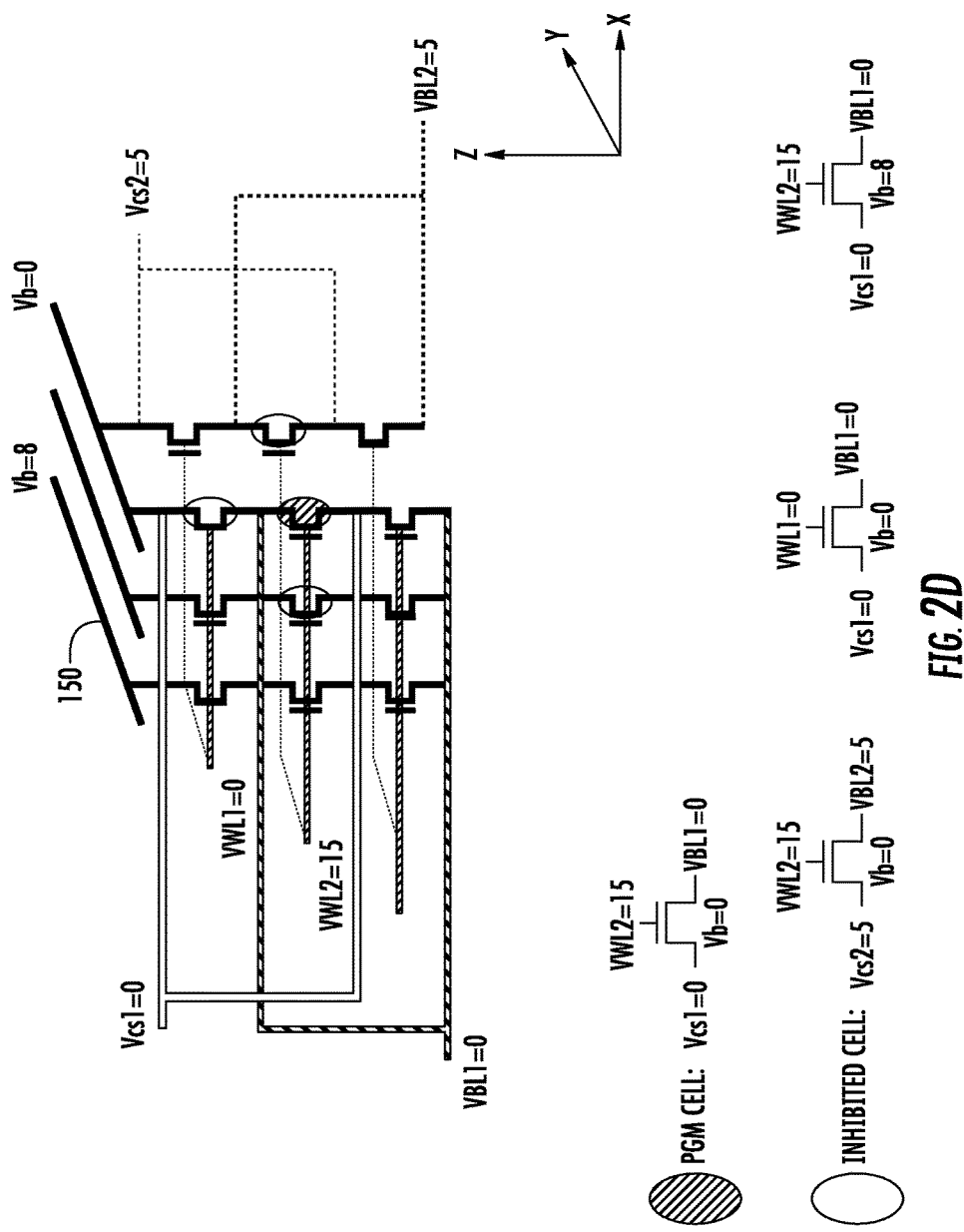
Figure 2E:
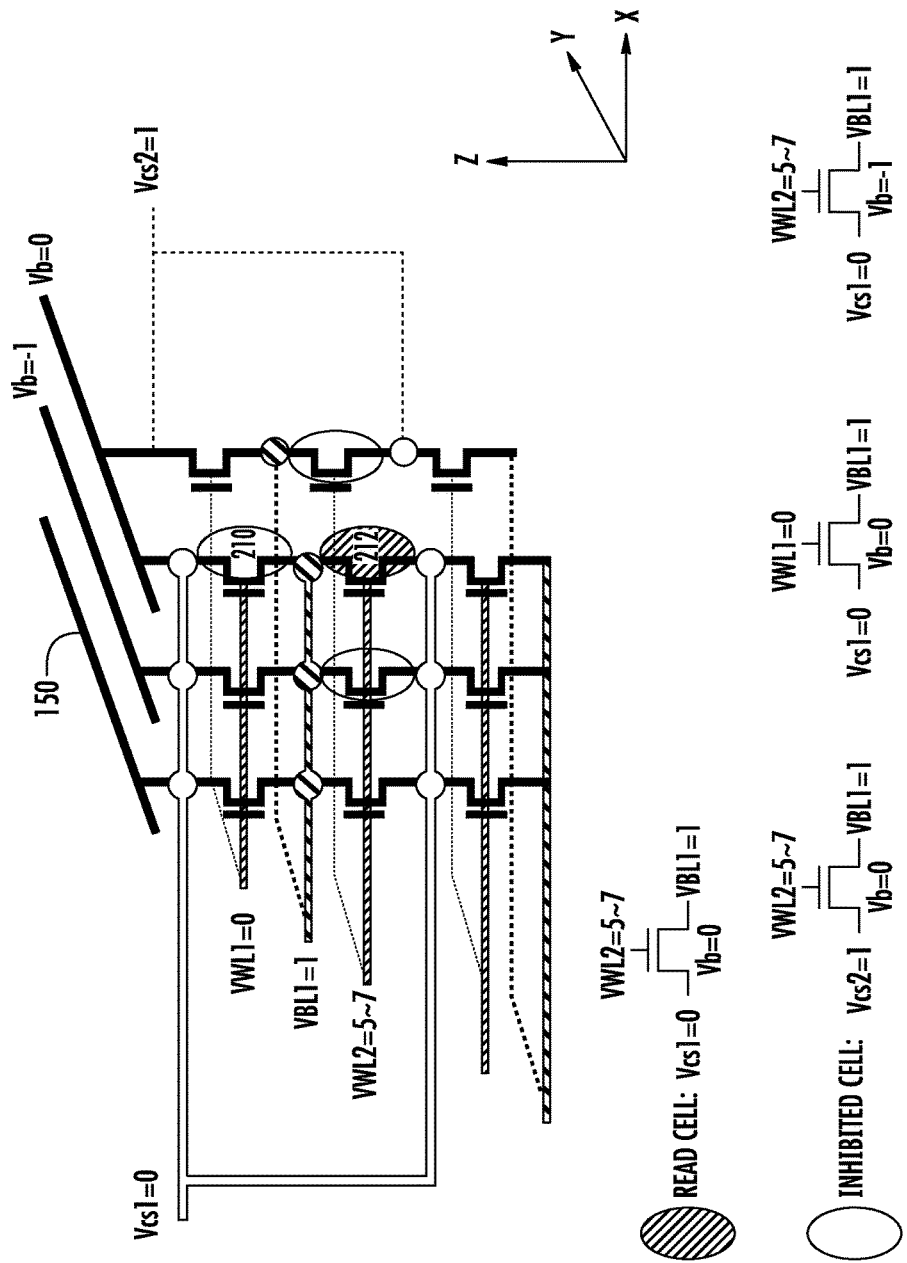
Figure 2F:
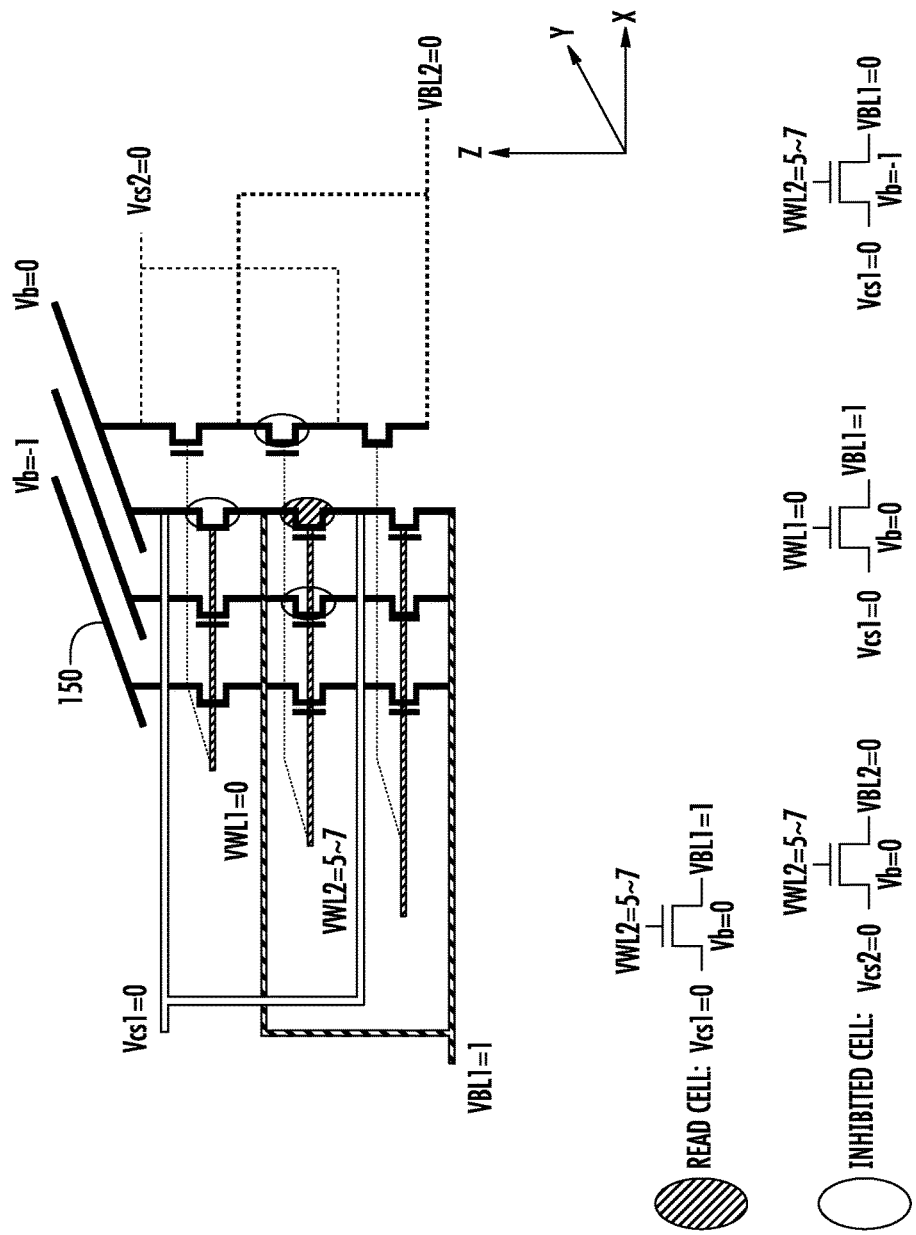
Figure 2G:
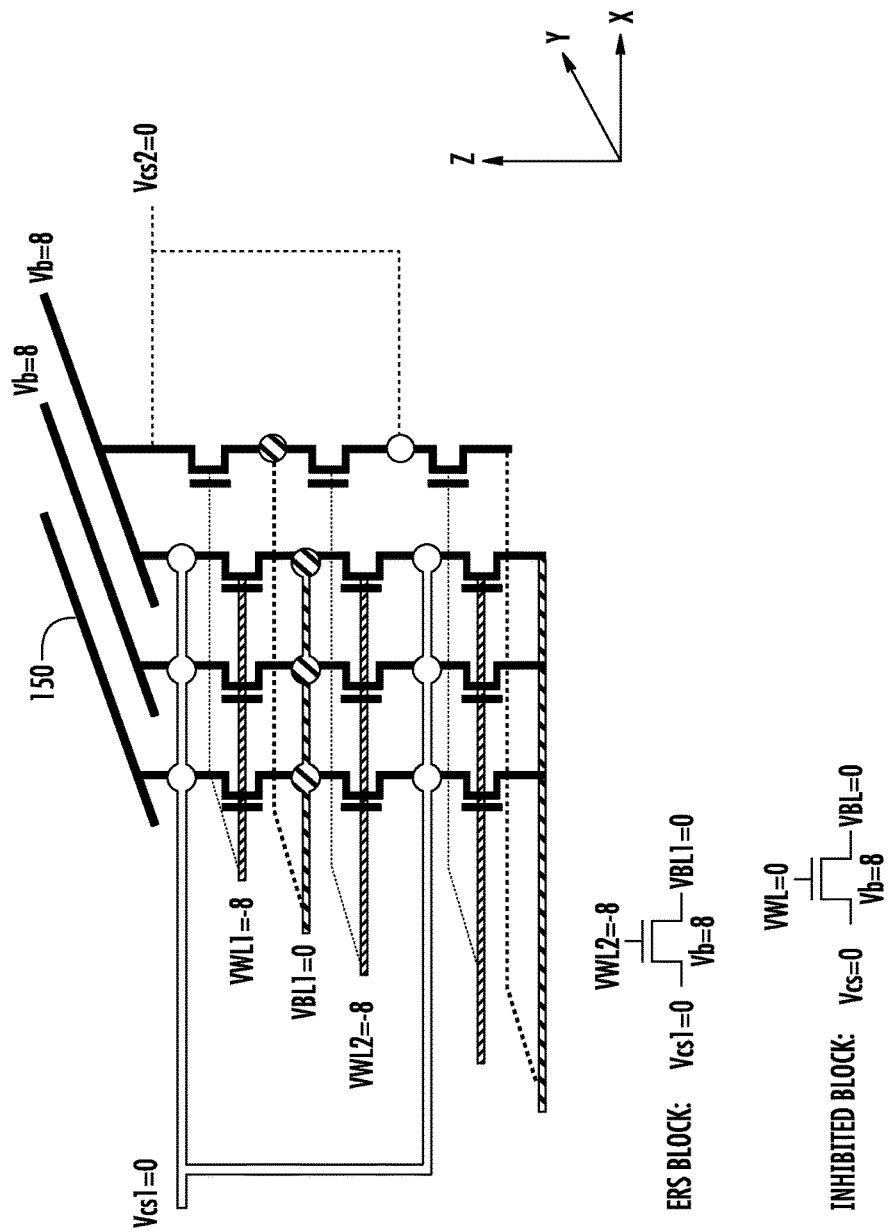
Figure 2H:
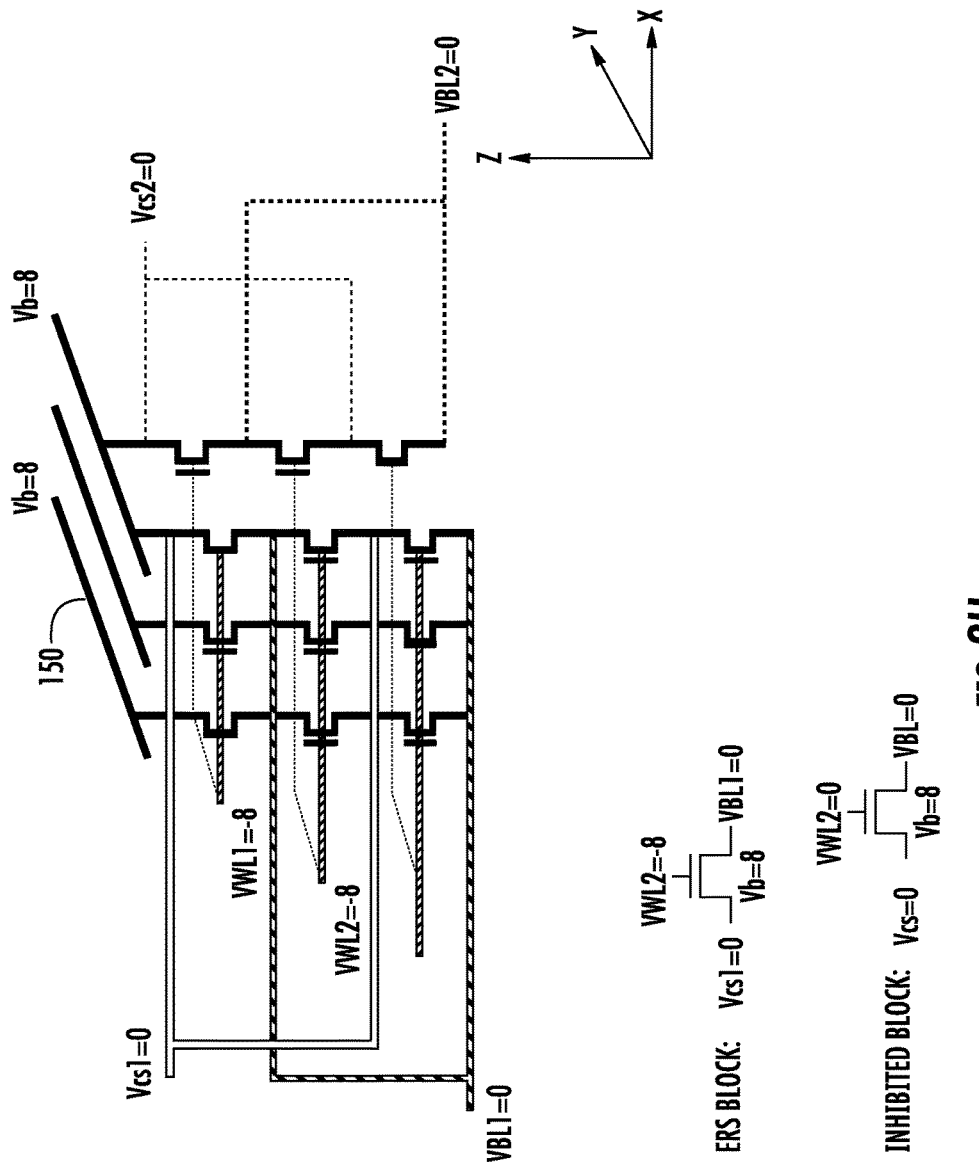
Figure 3A:
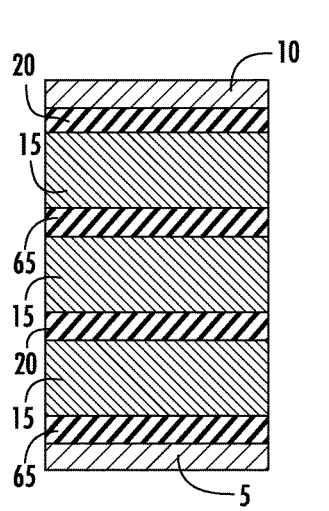
Figure 3B:
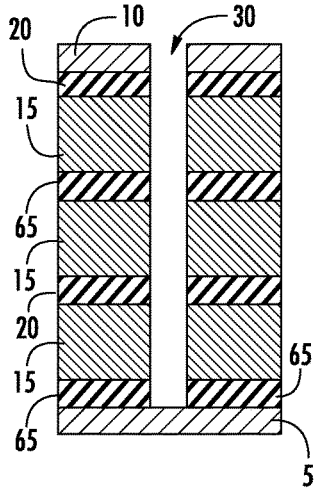
Figure 3C:
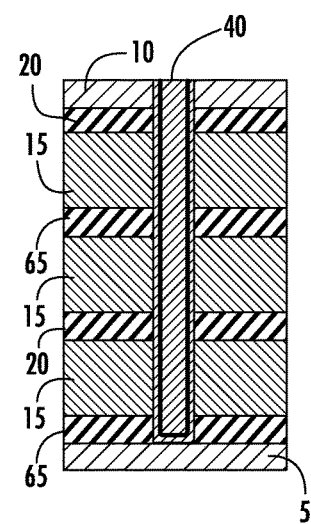
Figure 3D:
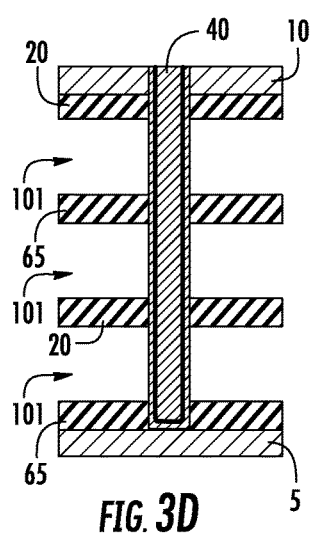
Figure 3E:
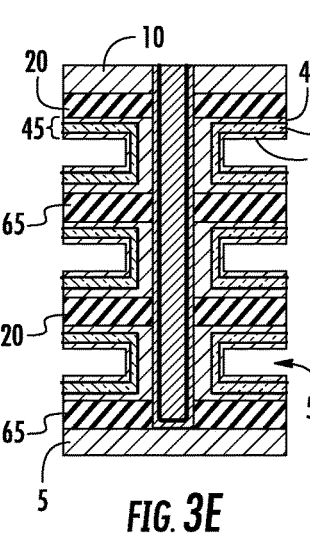
Figure 3F:
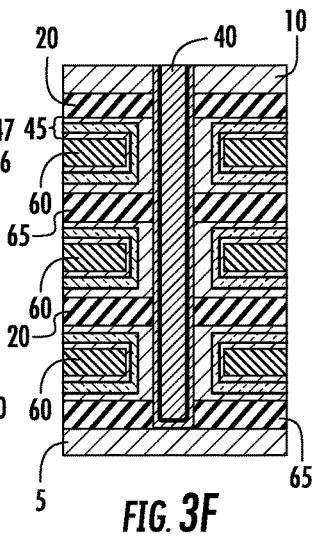
Figure 4:
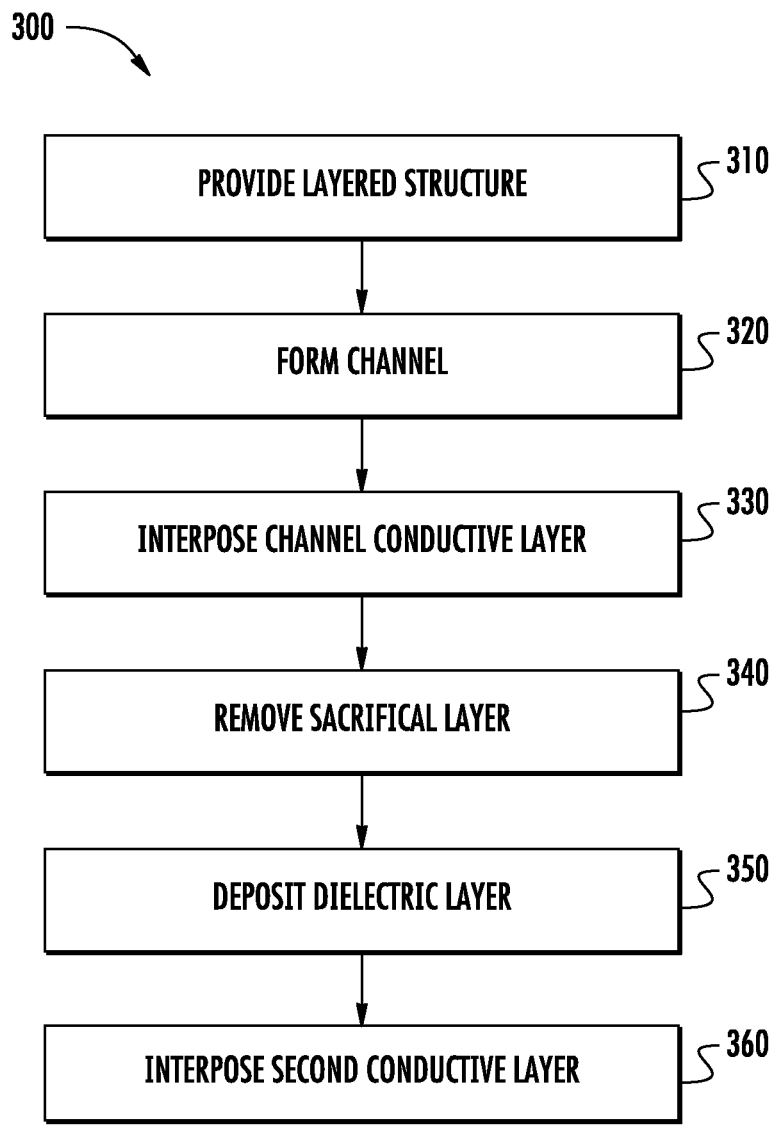

Having thus described certain example embodiments of the present disclosure in general terms, reference will now be made to the accompanying drawings, which are not necessarily drawn to scale, and wherein:

FIG. 1A illustrates a cross section of a string of memory cells of a three dimensional memory according to an embodiment of the invention;

FIG. 1B illustrates a staircase view of a string of memory cells, according to an embodiment of the invention;

FIG. 1C illustrates a top view of memory cells in a matrix according to an embodiment of the invention;

FIG. 2A illustrates an algorithm according to an embodiment of the invention;

FIG. 2B illustrates an algorithm according to an embodiment of the invention;

FIG. 2C-D illustrates-program algorithms according to an embodiment of the invention;

FIG. 2E-F illustrates read algorithms according to an embodiment of the invention;

FIG. 2G-H illustrates erase algorithms according to an embodiment of the invention;

FIGS. 3A-3F illustrate cross sections of some of the steps of forming a string of memory cells, according to an embodiment of the invention; and FIG. 4 is a flowchart illustrating a process for fabricating a string of memory cells according to an embodiment of the invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a gate structure" includes a plurality of such gate structures.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

As used herein, "a string of memory cells" refers to a component of a semiconductor device, such as a memory device. Non-limiting examples of memory devices include flash memory devices (e.g., a NOR flash memory device). Erasable programmable read-only memory (EPROM) and electrically erasable read-only memory (EEPROM) devices are non-limiting examples of flash memory devices. The string of memory cells of the invention may be a structure portion of a three dimensional memory array and/or device or a sub-assembly of a component or components of such three dimensional memory structures.

As used herein, a "non-volatile memory device" refers to a semiconductor device which is able to store information even when the supply of electricity is removed. Non-volatile memory includes, without limitation, Mask Read-Only Memory, Programmable Read-Only Memory, Erasable Programmable Read-Only Memory, Electrically Erasable Programmable Read-Only Memory, and Flash Memory, such as NAND and NOR flash memory.

As used herein, a "substrate" may include any underlying material or materials upon which a device, a circuit, an epitaxial layer, or a semiconductor may be formed. Generally, a substrate may be used to define the layer or layers that underlie a semiconductor device or even forms the base layer of a semiconductor device. The substrate may include one or any combination of silicon, doped silicon, germanium, silicon germanium, semiconductor compounds, or other semiconductor materials.

The string of memory cells of the three dimensional memory of the invention and methods of manufacturing such devices results in a string of memory cells that improves capacity; thereby, provides improving the scalability of such memory structures, such as for 3D NOR flash memory. In turn, such scaling reduces or eliminates the extent of current leakage that may be experienced by three dimensional memory. The invention provides a string of memory cells of a three dimensional memory (e.g., a non-volatile memory device such as a 3D NOR flash memory device) and methods of manufacturing such devices that provides scalable high density three dimensional memory configured for random access.

FIG. 1A illustrates a cross section of a string of memory cells 100 comprising a common source line, word line, and bit line according to an embodiment of the invention. In the illustrated embodiment, the string of memory cells 100 comprises the memory cells C1, C2, and C3. The string of memory cells 100 comprises a cap layer 5, one or more third conductive layers 65, one or more dielectric layers 45, one or more second conductive layers 60, one or more first conductive layers 20, and an insulating layer 10. The string of memory cells 100 may further comprise a channel conductive layer 40.

In various embodiments, the cap layer 5 and/or the insulating layer 10 are configured to enclose the string of memory cells therebetween. For example, in some embodiments, the cap layer 5 may cap one end of the string of memory cells 100 and the insulating layer may isolate the cells of the memory string 100 from the metal routing of the three-dimensional memory assembly/array/device. In various embodiments, the cap layer 5 may be and/or act as a substrate. For example, the cap layer 5 may be made of oxide, silicon, doped silicon, germanium, silicon germanium, semiconductor compounds, or other semiconductor materials. The insulating layer 10 may be an oxide layer, in various embodiments.

In various embodiments, the first conductive layers 20 may each correspond to a common source line. In various embodiments, the second conductive layers 60 may each correspond to one or more word lines. The second conductive layer 60 may be configured to correspond to (e.g., include) a plurality of word lines up to an order of N word lines. The third conductive layers 65 may each correspond to a bit line. Each memory cell in the matrix includes a transistor structure having a gate, a drain, a source, and a channel defined between the drain and the source. The gate may be connected to the word line, the drain may be connected to the bit line, and the source may be connected to a source line, which in turn may be connected to common ground. Each of the first conductive layers 20, second conductive layers 60, and third conductive layers 65 may be made of n+poly, poly-silicon layer, metal, or other conductive material.

As depicted, the dielectric layer 45 comprises at least one of a block layer, storage layer, or tunnel layer. The dielectric layer 45 may comprise an oxide/nitride/oxide (ONO) layer such that the block layer may correspond to the oxide layer, the storage layer may correspond to the nitride layer, and the tunnel layer may correspond to the oxide layer as described herein. In various embodiments, the dielectric layer 45 is formed by replacement.

As shown in FIG. 1A, the string of memory cells comprises several memory cells. For example, there are at least two memory cells (cell C1 and cell C2) in this string. The cell C1 comprises a first conductive layer 20, a dielectric layer 45, a second conductive layer 60, and a third conductive layer 65. The first conductive layer 20 referred as one common source line (e.g., CS1). The second conductive layer 60 may be referred to as a word line. The third conductive layer 65 may be referred to as a bit line. The cell C2 comprises a third conductive layer 65, a dielectric layer 45, a second conductive layer 60, and a first conductive layer 20. The first conductive layer 20 referred as one common source line (e.g., CS1). The second conductive layer 60 may be referred to as a word line. The third conductive layer 65 may be referred to as a bit line. The cell C1 and the cell C2 shares the same third conductive layer 65 (e.g., have a common bit line). Likewise, the cell C2 and the cell C3 shares a same common source line (e.g., CS1) 20.

FIG. 1B illustrates a staircase view of a string of memory cells according to an embodiment of the invention. The first conductive layer 20, the dielectric layer 45, the second conductive layer 60, and the third conductive layer 65 are structured in a staircase of a memory cell C1 Likewise, the memory cell C2 has similar staircase structure as cell C1 and shares a same bit line 65.

FIG. 1C illustrates a top view of memory cells in a matrix according to an embodiment of the invention. The memory cells in the matrix comprises a plurality of memory strings 100. As depicted, the memory cells in the matrix (e.g., a non-volatile memory device) comprises a plurality of word lines (of which WL1, WL2, WL3, and WL4 are illustrated) that intersect a plurality of bit lines (e.g., BL1). A memory cell is located at each intersecting point of a word line and a bit line. As further depicted, the memory cells in the matrix comprises a plurality of common source lines (of which CS1 and CS2 are illustrated) that also intersect a plurality of bit lines (e.g., BL1). The layers as described above, for example, are further depicted in staircase 202 as described herein with reference to FIG. 1B.

Thus, a plurality of memory strings 100 may be combined into a three-dimensional memory array. The three-dimensional memory array may be a part of a nonvolatile memory device for improving gate capacity. Each of the memory strings comprises a plurality of memory cells (e.g., C1, C2, C3). Each memory string is operatively attached to a channel line 150, as shown in FIGS. 2A-2H via the channel conductive layer 40. Each of the memory cells has a first end/terminal/electrode operatively connected to a bit line. For example, cell C1 may be attached to a bit line 130 via a bit line end/terminal/electrode comprising at least a portion of the third conductive layer 65. Each of the memory cells has a second end/terminal/electrode operatively connected to a source line. For example, C1 may be attached to a common source line 140, 142 via a source line end/terminal/ electrode comprising at least a portion of the first conductive layer 20. Additionally, each memory cell has a third end/ terminal/electrode operatively connected to a word line. For example, cell C1 may be attached to word line WL1 via a word line end/terminal/electrode comprising at least a portion of the second conductive layer 60. In various embodiments, each pair of adjacent memory cells shares one of a bit line and a source line. For example, cells C1 and C2 share the same third conductive layer 65 and therefore share a bit line 130 due to their shared bit line end/terminal/electrode. In another example, cells C2 and C3 share the same first conductive layer 20 and therefore share a source line 140, 142 due to their shared source line end/terminal/electrode.

FIG. 2A illustrates an algorithm according to an embodiment of the invention. As depicted in FIG. 2A, a multi-dimensional memory array 1000 comprises a plurality of memory strings 110. In one embodiment, each memory string 110 is structured in the same manner as the memory string 100 shown in FIGS. 1A-1C. However, the memory strings 110 may each have more of fewer memory cells than the string of memory cells 100 (e.g., each memory string 110 may comprise more of fewer than three memory cells associated therewith). Each memory string 110 comprises a first end 120 structured to connect to a channel line 150 and a second end 115 structured to connect to a bit line 130 in a pre-determined direction (e.g., a vertical direction). The channel line 150 may be connected to the channel conductive layer 40 for each memory string. The channel line 150 is capable of providing an operation voltage to the channel conductive layer 40 for each memory cell of the string of memory cells comprising memory string 110.

FIG. 2B illustrates an algorithm according to an embodiment of the invention. The multi-dimensional memory array 2000 comprises a plurality of memory strings 110. The plurality of memory strings 110 comprises a first end 120 structured to connect to a channel line 150 and a second end 115 structured to connect to a bit line 130 in a pre-determined direction. Each memory string 110 comprises at least one memory cell. The first terminal 160 of the at least one memory cell is configured to connect to the bit line 130.

In some embodiments, a second terminal 170 of the at least one memory cell is configured to connect to a common source line 140, 142. As depicted, the plurality of memory strings 110 is structured in a plane comprising at least one of an x plane, y plane, or z plane.

FIGS. 2C-2H illustrate various algorithms according to an embodiment of the invention, such as program, read, and erase algorithms for embodiments of the present invention. The multi-dimensional memory array as depicted may optionally comprise a plurality of memory strings, a first end structured to connect to a channel, and a second end structured to connect to a bit line in a pre-determined direction as described herein with reference to FIGS. 2A-2B.

With reference to FIG. 2C, a program algorithm is illustrated according to an embodiment of the invention. As the legend below the diagram illustrates, memory cell 210 comprises a program cell and memory cell 212 comprises an inhibited cell. In some embodiments, the non-volatile memory device may be operable to perform a program operation based, at least in part, on channel hot electron injection such that a carrier may be injected from the channel to the dielectric (e.g., dielectric layer 45). In an example embodiment, at a common source voltage (e.g., VCS1=0V, where V is the unit of measure for Voltage) applied to the memory cell 210 (e.g., the program cell) without the application of a voltage bias (Vb), the programming operation may occur at a predetermined word line voltage (e.g., VWL2=9.5V) and/or a predetermined bit line voltage (e.g., VBL1=4.5V). Alternatively or additionally, the non-volatile memory device may be configured to suppress, via an inhibition operation, the hot electron injection in response to the application of a different voltage bias in some memory cells. The inhibition operation may prevent current leakage and damage to the dielectric (e.g., dielectric 45) should the carrier interfere with the structure of the dielectric. For example, at a common source voltage (e.g., VCS1=0V) applied to the memory cell 212 (e.g., the inhibited cell) with the application of a voltage bias (e.g., Vb=0 and Vb=3), an inhibition operation may occur at a predetermined word line voltage of, for example, VWL1=0~Vt-1 and VWL2=9.5V and/or bit line voltage of, for example, VBL1=4.5V.

FIG. 2D illustrates a program algorithm according to an embodiment of the invention. In some embodiments, the non-volatile memory device may be operable to perform a program operation based, at least in part, on FN injection (e.g., Fowler-Nordheim electron injection or tunneling injection) such that charge carriers may be injected, for example, via an insulating layer to an electric conductor. In an example embodiment, at a common source voltage (e.g., VCS1=0V) applied to the program cell without the application of a voltage bias, the programming operation may occur at a predetermined word line voltage (e.g., VWL2=15V) and/or a predetermined bit line voltage (e.g., VBL1=0V). Alternatively or additionally, the non-volatile memory device may be configured to suppress, via an inhibition operation, the FN injection in response to the application of a different voltage bias to some memory cells as described herein. The inhibition operation may weaken the electric field corresponding to the tunneling layer. For example, at a common source voltage (e.g., VCS2=5V, VCS1=0V, and VCS1=0V respectively) applied to the memory cell (e.g., the inhibited cell) with the application of a voltage bias (e.g., Vb=0, Vb=0, and Vb=8), an inhibition operation may occur at a predetermined word line voltage of, for example, VWL2=15V, VWL1=0V, and VWL2=15V and/or bit line voltage of, for example, VBL2=5, VBL1=0V, and VBL1=0V.

FIGS. 2E-F illustrate a read algorithm according to an embodiment of the invention. In some embodiments, the non-volatile memory device may be operable to perform the read operation such that current may flow through the channel to the bit line when a predetermined voltage is applied to the gate corresponding to the non-volatile memory device. In this regard, the bit line voltage is reduced (e.g., pulled down). In an example embodiment, at a common source voltage (e.g., VCS1=0V) applied to the read cell without the application of a voltage bias, the read operation may occur at a predetermined word line voltage (e.g., VWL2=5~7V) and/or a predetermined bit line voltage (e.g., VBL1=1V). Alternatively or additionally, the non-volatile memory device may be configured to decrease, via an inhibition operation, the current (e.g., inhibit the read operation) in response to the application of a different voltage bias to some memory cells. For example, at a common source voltage (e.g., VCS2=1V, VCS1=0V, and VCS1=0V respectively) applied to the memory cell (e.g., the inhibited cell) with the application of a voltage bias (e.g., Vb=0, Vb=0, and Vb=−1), an inhibition operation may occur at a predetermined word line voltage (e.g., VWL2=5~7V, VWL1=0V, and VWL2=5~7V) and/or bit line voltage (e.g., VBL1=1V, VBL1=1V, and VBL1=1V).

FIGS. 2G-H illustrate an erase algorithm according to an embodiment of the invention. In some embodiments, the non-volatile memory device may be configured to perform an erase operation based, at least in part, on FN injection. In this regard, the non-volatile memory device may be configured to set the bias to a predetermined value (e.g., zero) to suppress, via an inhibition operation, the FN injection. For example, at a common source voltage (e.g., VCS=0V) applied to the memory cell (e.g., the inhibited block) and with the application of a voltage bias (e.g., Vb=8), an inhibition operation may occur at a predetermined word line voltage (e.g., VWL=0V) and/or bit line voltage (e.g., VBL=0V).

FIGS. 3A-3F illustrate a cross section view of some of the steps of forming a string of memory cells 100 of a three dimensional memory according to an embodiment of the invention. FIG. 4 provides a flowchart describing the steps illustrated by FIGS. 3A-3F. Starting at step 310, shown in FIG. 3A, a layered structure 300 is provided. The layered structure 300 comprises the cap layer 5, the one or more third conductive layers 65, one or more sacrificial layers 15, the one or more first conductive layers 20, and the insulating layer 10. The sacrificial layers may be made of SiN or other appropriate material. For example, the layered structure 300 comprises a cap layer 5. Adjacent the cap layer 5 is a third conductive layer 65. Adjacent the third conductive layer 65, but on the opposite side of the third conductive layer 65 as the cap layer 5, is a sacrificial layer 15. Adjacent to the side of the sacrificial layer 15 that is opposite the conductive layer 65 is a first conductive layer 20. The layered structure continues with a sacrificial layer 15, a third conductive layer 65, a sacrificial layer 15, and a first conductive layer 20. The layered structure 300 may continue in this manner until terminating in an insulating layer 10 adjacent a first conductive layer 20.

Referring to FIG. 4, at step 320, the channel is formed, as shown in FIG. 3B. For example, a hole 30 may be etched through the layered structure 300, such that the hole 30 passes through insulating layer 10, the one or more first conductive layers 20, the one or more sacrificial layers 15, and the third conductive layers 65. In some embodiments, the etching process results in the hole 30 such that the hole 30 would be filled with conductive materials later to act as a vertical channel for each memory cells. In some embodiments, the hole 30 may be perpendicular to the boundary lines of at least one of the layers of the layered structure 300.

As shown in FIG. 4, step 330 comprises interposing or depositing the channel conductive layer 40 into the hole 30. For example, as depicted in FIG. 3C, the channel conductive layer 40 may substantially fill the hole 30. In at least one embodiment, the channel conductive layer 40 comprises poly-silicon. In some embodiments, the channel conductive layer 40 may be metal, silicon (Si), or another suitable material.

Returning to FIG. 4, at step 340 at least one of the one or more sacrificial layers 15 is removed. FIG. 3D illustrates the layered structure 300 after the removal of the sacrificial layers 15. The sacrificial layer 15, for example a SiN layer, may be removed by an etching process. The removal of the sacrificial layer(s) 15 results in a plurality of openings 101. Each opening is bordered along one edge by a first conductive layer 20, a third conductive layer 65, and the channel conductive layer 40.

With reference to FIG. 4, at step 350, the one or more dielectric layers 45 are disposed. For example, of dielectric layer 45 may be deposited within each of the openings 101, as shown in FIG. 3E. For example, a dielectric layer 45 may be deposited along the internal surfaces of the opening 101. For example, the dielectric layer 45 may be deposited along within the opening 101 such that a portion of the dielectric layer 45 borders a first conductive layer 20, another portion of the dielectric layer 45 borders the third conductive layer 65, and another portion of the dielectric layer 45 borders the channel conductive layer 40. The dielectric layer 45 may be deposited such that a remaining opening 50 results. As depicted, the dielectric layer 45 comprises an ONO layer (e.g., an oxide/nitride/oxide layer or fill-in). The dielectric layer 45 is similar to a lamination structure having multiple layers including a lower oxide film 46, a nitride film 47, and an upper oxide film 48.

Returning to FIG. 4, at step 360, the second conductive layer 60 is interposed or deposited within the remaining opening 50. A cross section of the string of memory cells resulting from step 360 is illustrated in FIG. 1F. The second conductive layer 60 may be interposed within the second opening 50 so as to substantially fill the remaining opening 50

In an embodiment of the invention, the second conductive layer 60 may function, for example, as a word line or a gate electrode. The word line or gate electrode may be configured for read, erase, or other programmatic functions.

Following these steps and/or interspersed therebetween, any additional steps known in the art may be used to finalize the fabrication of the string of memory cells. Such steps may include forming a second conductive layer or a control gate layer and may include other additional steps depending upon the design and desired attributes of the gate structure.

An aspect of the invention provides a string of memory cells, a three dimensional memory array and/or device fabricated according to a method of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A three-dimensional memory cell comprising:
   a first conductive layer;
   a third conductive layer spaced apart from the first conductive layer;
   a channel conductive layer connecting the first conductive layer and the third conductive layer to form an opening having internal surfaces;
   a dielectric layer disposed along the internal surfaces of the opening surrounded by the first conductive layer, the channel conductive layer and the third conductive layer; and
   a second conductive layer interposed and substantially filling a remaining open portion formed by the dielectric layer,
   wherein the first conductive layer, the dielectric layer, and the second conductive layer are configured to form a staircase structure.

2. The three-dimensional memory cell of claim 1, wherein the first conductive layer corresponds to at least one common source line.

3. The three-dimensional memory cell of claim 1, wherein the third conductive layer corresponds to at least one bit line.

4. The three-dimensional memory cell of claim 1, wherein the second conductive layer corresponds to at least one word line.

5. The three-dimensional memory cell of claim 1, wherein the dielectric layer comprises at least one of a block layer, a storage layer, or a tunnel layer.

6. The three-dimensional memory cell of claim 1, wherein the three-dimensional memory cell is one cell of a plurality of cells along a string of memory cells.

7. The three-dimensional memory cell of claim 1, wherein the dielectric layer comprises a lower oxide film, a nitride film, and an upper oxide film.

8. The three-dimensional memory cell of claim 1, wherein the insulating layer, the first conductive layer, the dielectric layer, and the second conductive layer are structured to connect the bit line in a staircase formation.

9. The three-dimensional memory cell of claim 8, wherein the staircase formation comprises a third conductive layer.

\* \* \* \* \*